(12) United States Patent
Huang

(10) Patent No.: US 11,176,902 B2
(45) Date of Patent: Nov. 16, 2021

(54) SHIFT REGISTER CIRCUIT AND DISPLAY PANEL USING SAME

(71) Applicant: HKC Corporation Limited, Shenzhen (CN)

(72) Inventor: Beizhou Huang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 804 days.

(21) Appl. No.: 16/068,219

(22) PCT Filed: Jan. 24, 2018

(86) PCT No.: PCT/CN2018/073938
§ 371 (c)(1),
(2) Date: Jul. 5, 2018

(87) PCT Pub. No.: WO2019/061965
PCT Pub. Date: Apr. 4, 2019

(65) Prior Publication Data
US 2021/0193068 A1    Jun. 24, 2021

(30) Foreign Application Priority Data

Sep. 26, 2017  (CN) .......................... 201710884894.9

(51) Int. Cl.
*G09G 3/36* (2006.01)
*G11C 19/28* (2006.01)

(52) U.S. Cl.
CPC ........... *G09G 3/3677* (2013.01); *G11C 19/28* (2013.01); *G09G 2300/0408* (2013.01); *G09G 2310/0286* (2013.01)

(58) Field of Classification Search
CPC .......... G09G 3/36; G09G 3/20; G09G 3/3208; G09G 2310/08; G09G 2354/00;
(Continued)

(56) References Cited

U.S. PATENT DOCUMENTS

| 6,885,723 | B2 * | 4/2005 | Yu ........................... | G11C 19/28 377/78 |
| 6,970,530 | B1 * | 11/2005 | Wang ................... | G11C 19/282 345/100 |
| 8,373,637 | B2 * | 2/2013 | Leong .................... | G11C 19/28 345/100 |

(Continued)

FOREIGN PATENT DOCUMENTS

| CN | 101976580 A | 2/2011 |
| CN | 107016973 A | 8/2017 |

(Continued)

OTHER PUBLICATIONS

International Search Report and Written Opinion dated May 30, 2018, in the corresponding PCT application PCT/CN2018/073938, 9 pages in Chinese, 2 pages in English.

*Primary Examiner* — Olga V Merkoulova
(74) *Attorney, Agent, or Firm* — Juan Carlos A. Marquez; Marquez IP Law Office, PLLC

(57) ABSTRACT

A shift register circuit includes a plurality of shift registers, each including: a first switch, a control end thereof is electrically coupled to a control signal; a second switch, where a control end thereof is electrically coupled to a first node; a third switch, where a control end thereof is electrically coupled to a second node; a fourth switch, where a control end thereof is electrically coupled to the second node; a fifth switch, where a control end thereof is electrically coupled to the first node; a sixth switch, where a control end thereof is electrically coupled to a fourth node; a seventh switch, where a control end thereof is electrically coupled to a fifth node; and a high frequency signal circuit, electrically coupled to a preset low potential, the sixth switch, and the seventh switch of the shift register circuit.

20 Claims, 11 Drawing Sheets

(58) Field of Classification Search
CPC ......... G09G 2360/144; G09G 2360/16; G09G 3/3233; G09G 3/3607; G09G 2320/066; G09G 2380/10; G09G 3/34; G09G 2320/0626; G09G 2330/021
See application file for complete search history.

(56) References Cited

U.S. PATENT DOCUMENTS

| | | | | |
|---|---|---|---|---|
| 8,487,862 B2* | 7/2013 | Chiang | ................. | G11C 19/28 345/100 |
| 8,817,943 B2* | 8/2014 | Jang | .................... | G09G 3/3266 377/64 |
| 9,482,890 B2* | 11/2016 | Sugiyama | ......... | G02F 1/136286 |
| 2004/0217935 A1* | 11/2004 | Jeon | ....................... | G11C 19/28 345/100 |
| 2005/0008114 A1* | 1/2005 | Moon | .................. | G09G 3/3677 377/64 |
| 2005/0031068 A1* | 2/2005 | Chan | ...................... | G11C 19/28 377/64 |
| 2005/0036581 A1* | 2/2005 | Lin | .......................... | G11C 8/04 377/54 |
| 2008/0101529 A1* | 5/2008 | Tobita | .................... | G11C 19/28 377/64 |
| 2014/0079173 A1* | 3/2014 | Yan | ........................ | G11C 19/28 377/64 |
| 2015/0168760 A1* | 6/2015 | Sugiyama | ........... | H01L 27/1248 349/42 |
| 2015/0301415 A1* | 10/2015 | Sawada | ............. | G02F 1/134336 349/147 |
| 2018/0322840 A1* | 11/2018 | Chen | .................... | G09G 3/3677 |

FOREIGN PATENT DOCUMENTS

| | | |
|---|---|---|
| CN | 107068093 A | 8/2017 |
| CN | 107492361 A | 12/2017 |
| JP | 2008287753 A | 11/2008 |

* cited by examiner

SHIFT REGISTER CIRCUIT AND DISPLAY PANEL USING SAME

BACKGROUND

Technical Field

This application relates to the display field, and in particular, to a shift register circuit and a display panel using same.

Related Art

In recent years, with advancement of science and technologies, planar liquid crystal displays gradually proliferate because planar liquid crystal displays have advantages of being light and thin and the like. Currently, a drive circuit of a planar liquid crystal display is mainly implemented by connecting a panel to an external IC. However, the method cannot reduce product costs, and cannot enable panels to be thinner.

In addition, a liquid crystal display device generally has a gate drive circuit, a source drive circuit, and a pixel array. The pixel array has a plurality of pixel circuits. Each pixel circuit is switched on or off according to a scanning signal provided by the gate drive circuit, and displays a data image according to a data signal provided by the source drive circuit. Using the gate drive circuit as an example, the gate drive circuit generally has a plurality of shift registers, and outputs the scanning signal to the pixel array by transferring the scanning signal from a shift register to a next shift register, to sequentially switch on the pixel circuits and enable the pixel circuits to receive the data signal.

Therefore, in a process of manufacturing a drive circuit, a gate drive circuit is directly manufactured on an array substrate to replace a drive chip manufactured by connecting a panel to an external IC. This technology referred to as Gate on Array (GOA) may be directly applied to a peripheral of the panel, thereby simplifying a manufacturing process, reducing product costs, and enabling a panel to be thinner. In the GOA technology, a speed at which a shift register pulls down a gate signal usually affects performance of driving a pixel array by using a gate signal. However, because of time sequence setting of an existing panel and a leakage current possibly generated when a switch component in a shift register switches on/off a voltage, a speed at which the shift register pulls down a gate signal is reduced. If the speed at which the gate signal is pulled down can be effectively increased, a displayed image of the entire panel can be optimized, thereby improving quality of the displayed image. Therefore, to overcome the foregoing defect of the foregoing GOA circuit substrate technology, a shift register circuit having low manufacturing costs and an easy processing procedure is provided.

SUMMARY

To resolve the foregoing technical problem, an objective of this application is to provide a shift register circuit and a display panel using same.

The objective of this application is achieved and the technical problem of this application is resolved by using the following technical solutions: A shift register circuit provided according to this application comprises a plurality of shift registers, wherein each shift register comprises: a first switch, wherein a control end of the first switch is electrically coupled to a control signal, a first end of the first switch is electrically coupled to the control signal, and a second end of the first switch is electrically coupled to a first node; a second switch, wherein a control end of the second switch is electrically coupled to the first node, a first end of the second switch is electrically coupled to a frequency signal, and a second end of the second switch is electrically coupled to an output pulse signal; a third switch, wherein a control end of the third switch is electrically coupled to a second node, a first end of the third switch is electrically coupled to the output pulse signal, and a second end of the third switch is electrically coupled to a preset low potential; a fourth switch, wherein a control end of the fourth switch is electrically coupled to the second node, a first end of the fourth switch is electrically coupled to the first node, and a second end of the fourth switch is electrically coupled to the preset low potential; a fifth switch, wherein a control end of the fifth switch is electrically coupled to the first node, a first end of the fifth switch is electrically coupled to a frequency signal, and a second end of the fifth switch is electrically coupled to a third node; a sixth switch, wherein a control end of the sixth switch is electrically coupled to a fourth node, a first end of the sixth switch is electrically coupled to the fourth node, and a second end of the sixth switch is electrically coupled to a fifth node; a seventh switch, wherein a control end of the seventh switch is electrically coupled to the fifth node, a first end of the seventh switch is electrically coupled to the fourth node, and a second end of the seventh switch is electrically coupled to a sixth node; and a high frequency signal circuit, electrically coupled to the preset low potential, the sixth switch, and the seventh switch of the shift register circuit.

The objective of this application may be further achieved and the technical problem of this application may be further resolved by using the following technical solutions:

Another objective of this application is a shift register circuit, comprising a plurality of shift registers, wherein each shift register comprises: a first switch, wherein a control end of the first switch is electrically coupled to a control signal, a first end of the first switch is electrically coupled to the control signal, and a second end of the first switch is electrically coupled to a first node; a second switch, wherein a control end of the second switch is electrically coupled to the first node, a first end of the second switch is electrically coupled to a frequency signal, and a second end of the second switch is electrically coupled to an output pulse signal; a third switch, wherein a control end of the third switch is electrically coupled to a second node, a first end of the third switch is electrically coupled to the output pulse signal, and a second end of the third switch is electrically coupled to a preset low potential; a fourth switch, wherein a control end of the fourth switch is electrically coupled to the second node, a first end of the fourth switch is electrically coupled to the first node, and a second end of the fourth switch is electrically coupled to the preset low potential; a fifth switch, wherein a control end of the fifth switch is electrically coupled to the first node, a first end of the fifth switch is electrically coupled to a frequency signal, and a second end of the fifth switch is electrically coupled to a third node; a sixth switch, wherein a control end of the sixth switch is electrically coupled to a fourth node, a first end of the sixth switch is electrically coupled to the fourth node, and a second end of the sixth switch is electrically coupled to a fifth node; a seventh switch, wherein a control end of the seventh switch is electrically coupled to the fifth node, a first end of the seventh switch is electrically coupled to the fourth node, and a second end of the seventh switch is electrically coupled to a sixth node; and a high frequency signal circuit, electrically coupled to the preset low potential, the sixth switch, and the seventh switch of the shift register circuit, wherein the high frequency signal circuit further comprises: a fourteenth switch, wherein a control end of the fourteenth switch is electrically coupled to a frequency signal, a first end of the fourteenth switch is electrically coupled to the frequency signal, and a second end of the fourteenth switch is electrically coupled to the fourth node; a fifteenth switch, wherein a control end of the fifteenth switch is electrically coupled to a frequency signal, a first end of the fifteenth switch is electrically coupled to the frequency signal, and a second end of the fifteenth switch is electrically coupled to the fourth node; and a sixteenth switch, wherein a control end of the sixteenth switch is electrically coupled to a frequency signal, a first end of the sixteenth switch is electrically coupled to the fourth node, and a second end of the sixteenth switch is electrically coupled to the preset low potential.

A still another objective of this application is to provide a display panel, comprising: a first substrate; a second substrate, disposed opposite to the first substrate; and a plurality of shift registers, wherein each shift register comprises: a first switch, wherein a control end of the first switch is electrically coupled to a control signal, a first end of the first switch is electrically coupled to the control signal, and a second end of the first switch is electrically coupled to a first node; a second switch, wherein a control end of the second switch is electrically coupled to the first node, a first end of the second switch is electrically coupled to a frequency signal, and a second end of the second switch is electrically coupled to an output pulse signal; a third switch, wherein a control end of the third switch is electrically coupled to a second node, a first end of the third switch is electrically coupled to the output pulse signal, and a second end of the third switch is electrically coupled to a preset low potential; a fourth switch, wherein a control end of the fourth switch is electrically coupled to the second node, a first end of the fourth switch is electrically coupled to the first node, and a second end of the fourth switch is electrically coupled to the preset low potential; a fifth switch, wherein a control end of the fifth switch is electrically coupled to the first node, a first end of the fifth switch is electrically coupled to a frequency signal, and a second end of the fifth switch is electrically coupled to a third node; a sixth switch, wherein a control end of the sixth switch is electrically coupled to a fourth node, a first end of the sixth switch is electrically coupled to the fourth node, and a second end of the sixth switch is electrically coupled to a fifth node; a seventh switch, wherein a control end of the seventh switch is electrically coupled to the fifth node, a first end of the seventh switch is electrically coupled to the fourth node, and a second end of the seventh switch is electrically coupled to a sixth node; and a high frequency signal circuit, electrically coupled to the preset low potential, the sixth switch, and the seventh switch of the shift register circuit, wherein the shift register circuit is disposed on the first substrate or the second substrate.

In an embodiment of this application, the display panel further comprises a pull-down subcircuit, comprising: an eighth switch, wherein a control end of the eighth switch is electrically coupled to the sixth node, a first end of the eighth switch is electrically coupled to the output pulse signal, and a second end of the eighth switch is electrically coupled to the preset low potential.

In an embodiment of this application, the display panel further comprises a ninth switch, wherein a control end of the ninth switch is electrically coupled to the sixth node, a first end of the ninth switch is electrically coupled to the first node, and a second end of the ninth switch is electrically coupled to the preset low potential.

In an embodiment of this application, the display panel further comprises a pull-down subcircuit controller, comprising: the sixth switch, wherein the control end of the sixth switch is electrically coupled to the fourth node, the first end of the sixth switch is electrically coupled to the fourth node, and the second end of the sixth switch is electrically coupled to the fifth node; and the seventh switch, wherein the control end of the seventh switch is electrically coupled to the fifth node, the first end of the seventh switch is electrically coupled to the fourth node, and the second end of the seventh switch is electrically coupled to the sixth node.

In an embodiment of this application, the display panel further comprises a tenth switch, wherein a control end of the tenth switch is electrically coupled to a seventh node, a first end of the tenth switch is electrically coupled to the sixth node, and a second end of the tenth switch is electrically coupled to the preset low potential.

In an embodiment of this application, the display panel further comprises an eleventh switch, wherein a control end of the eleventh switch is electrically coupled to a seventh node, a first end of the eleventh switch is electrically coupled to the fifth node, and a second end of the eleventh switch is electrically coupled to the preset low potential.

In an embodiment of this application, the display panel further comprises a twelfth switch, wherein a control end of the twelfth switch is electrically coupled to an eighth node, a first end of the twelfth switch is electrically coupled to the sixth node, a second end of the twelfth switch is electrically coupled to the preset low potential and a thirteenth switch, a control end of the thirteenth switch is electrically coupled to the eighth node, a first end of the thirteenth switch is electrically coupled to the fifth node, and a second end of the thirteenth switch is electrically coupled to the preset low potential.

In an embodiment of this application, the high frequency signal circuit further comprises a fourteenth switch, a control end of the fourteenth switch is electrically coupled to a frequency signal, a first end of the fourteenth switch is electrically coupled to the frequency signal, and a second end of the fourteenth switch is electrically coupled to the fourth node.

This application can also achieve a low frequency and constant voltage effect by using a high frequency signal combination.

DETAILED DESCRIPTION

Figure 1A:
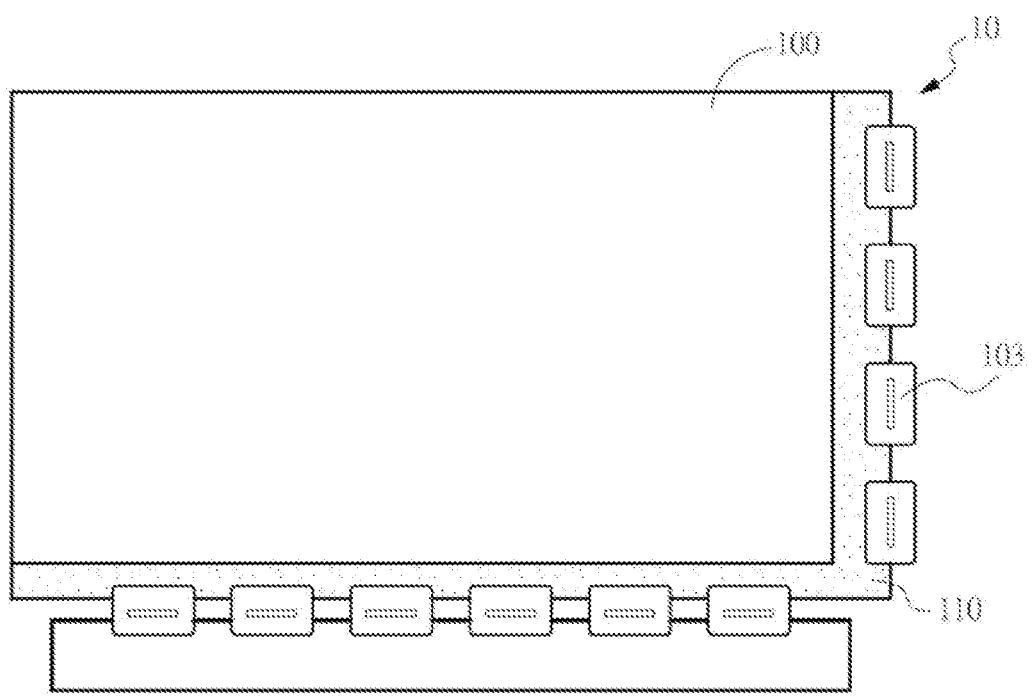
FIG. 1a is a schematic diagram of an exemplary liquid crystal display.

The following embodiments are described with reference to the accompanying drawings, to show examples of particular embodiments implemented by using this application. Direction-related terms provided in this application, for example, "above", "below", "front", "back", "left", "right", "inside", "outside", and "lateral face", merely refer to directions in the accompanying drawings. Therefore, the direction-related terms are used for the purpose of describing and understanding this application, and are not intended for limiting this application.

The accompanying drawings and the descriptions are considered as examples instead of limitations essentially. In the drawings, units having similar structures are represented by a same reference numeral. In addition, for ease of understanding and description, the size and the thickness of each component shown in the accompanying drawings are randomly selected, but this application is not limited thereto.

In the accompanying drawings, for clarity, the thicknesses of a layer, a film, a panel, a region, and the like are exaggerated. In the accompanying drawings, for ease of understanding and description, the thicknesses of some layers and regions are exaggerated. It should be understood that, when a component such as a layer, a film, a region, or a base is described as "above" another component, the component may be directly on the another component, or there may be a component disposed therebetween.

In addition, in the specification, unless otherwise explicitly described, the word "include" is understood as including the component, but excluding no other component. In addition, in the application, "on" means being located above or below a target component, but does not necessarily mean being located on the top based on a gravity direction.

To further illustrate technical measures used to achieve preset invention objectives and effects of this application, specific implementations, structures, features, and effects of a shift register circuit and a display panel using same provided in this application are described in detail below with reference to the accompanying drawings and specific embodiments.

The display panel in this application may include a liquid crystal display (LCD) panel, including: a switch array (thin film transistor, TFT) substrate, a color filter (CF) substrate, and a liquid crystal layer formed between the two substrates, or the display panel may be an organic light-emitting diode (OLED) panel or a quantum dots light-emitting diode (QLED) panel.

In an embodiment, the liquid crystal panel in this application may be a curved display panel.

In an embodiment of this application, an active array (TFT) and a CF may be formed on a same substrate.

FIG. 1a is a schematic diagram of an exemplary liquid crystal display. Referring to FIG. 1a, an exemplary liquid crystal display 10 includes: a CF substrate 100, an array substrate 110, and a drive chip 103 configured to drive a circuit.

Figure 1B:
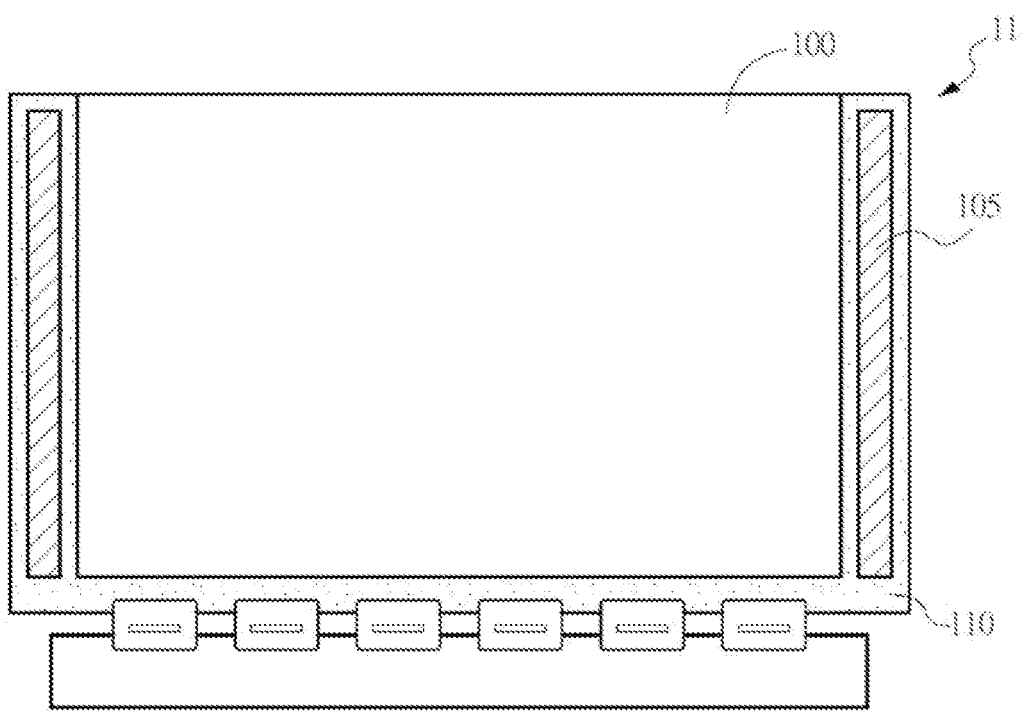
FIG. 1b is a schematic diagram of a liquid crystal display according to an embodiment of this application.

FIG. 1b is a schematic diagram of a liquid crystal display according to an embodiment of this application. Referring to FIG. 1b, in an embodiment of this application, a liquid crystal display 11 having a gate on array (GOA) includes a CF substrate 100, an array substrate 110, and a GOA 105, to manufacture a gate drive circuit on the array substrate 110.

Figure 1C:
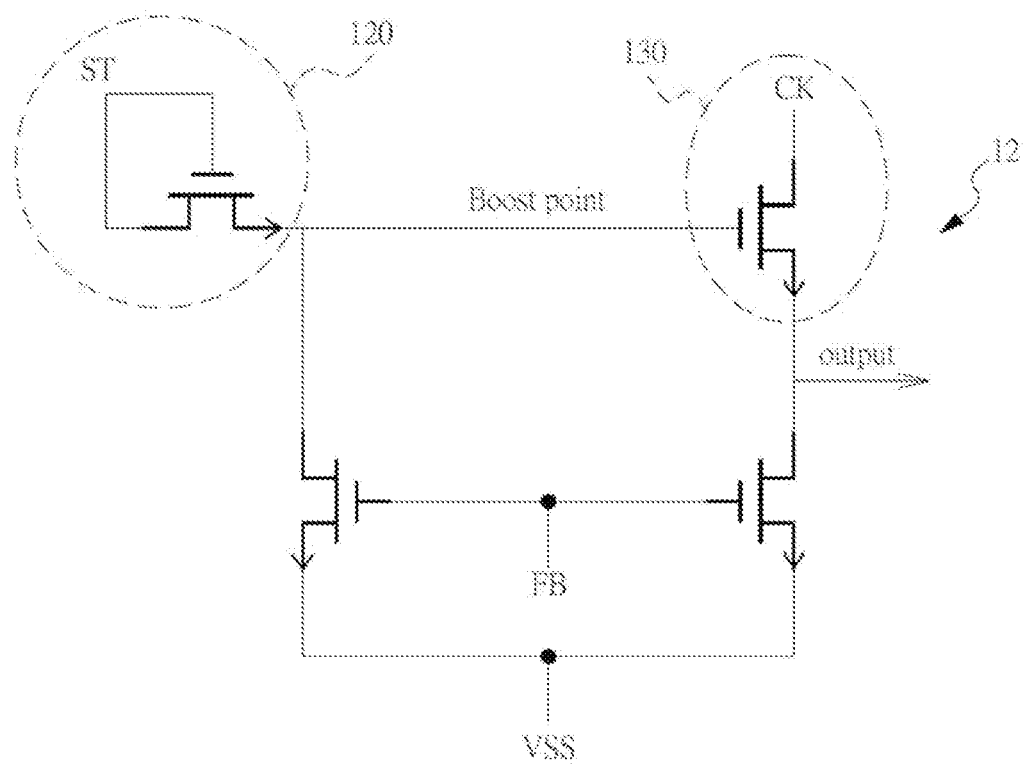
FIG. 1c is a schematic diagram of an exemplary Thompson circuit.

FIG. 1c is a schematic diagram of an exemplary Thompson circuit. Referring to FIG. 1c, a Thompson circuit 12 includes an input pulse signal circuit 120 and a frequency signal circuit 130. The input pulse signal circuit 120 is configured to provide a pre-charge power supply to the Thompson circuit 12. When the frequency signal circuit 130 provides a frequency signal for coupling, a boost point reaches a high voltage level.

Figure 1D:
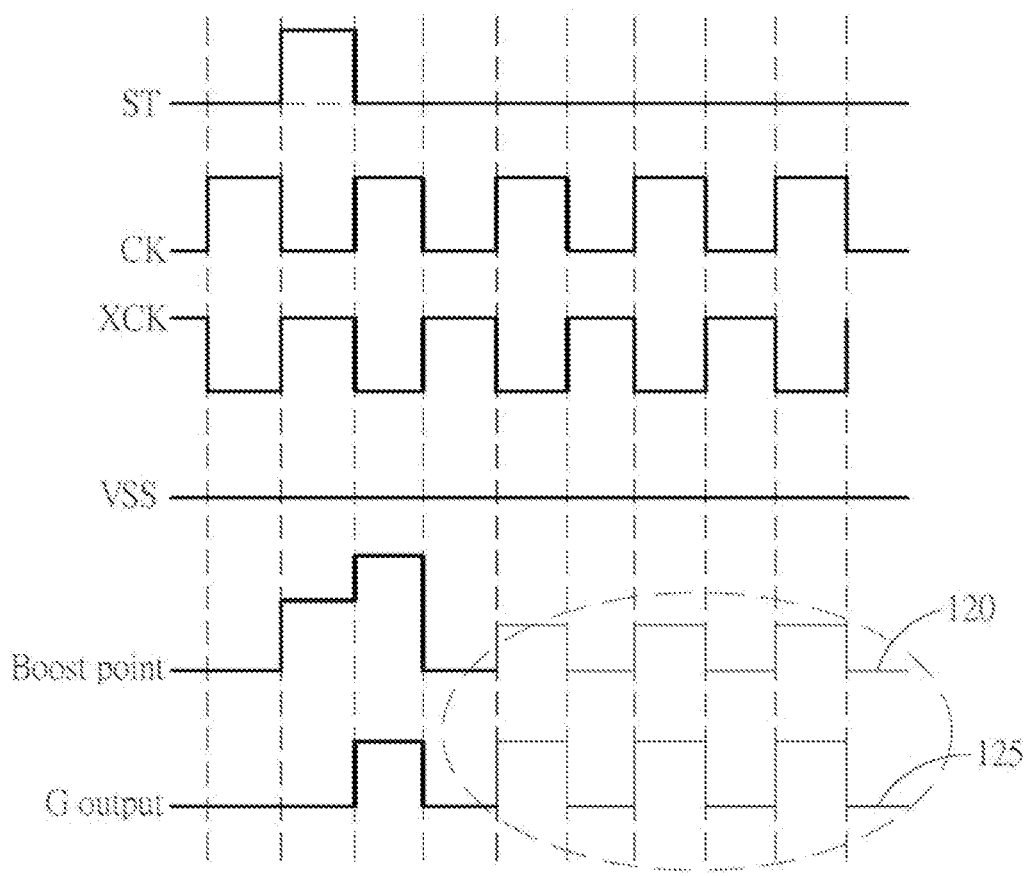
FIG. 1d is a schematic diagram of an exemplary boost point and an output waveform of a pulse signal.

FIG. 1d is a schematic diagram of an exemplary boost point and an output waveform of a pulse signal. Referring to FIG. 1c and FIG. 1d, the frequency signal (CK) is a periodic signal, and is constantly coupled to a waveform 120 of a boost point. Consequently, a pulse output signal (G output) opens a waveform 125 of an error action at an incorrect time on a non-gate (Gate line), causing an image anomaly.

Figure 2:
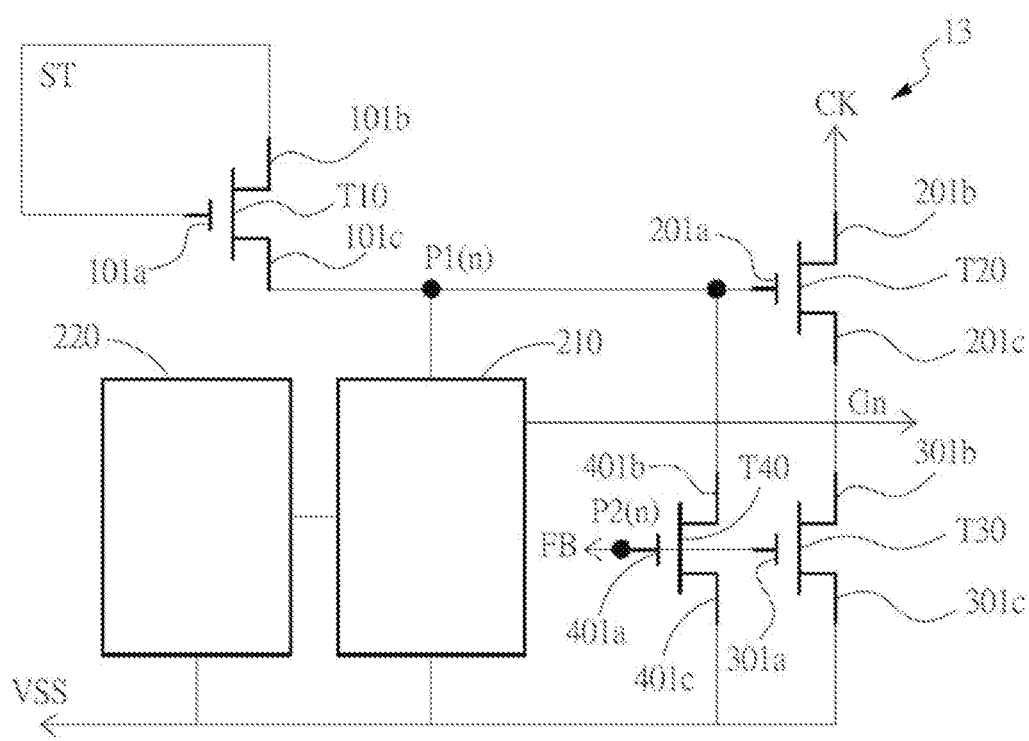
FIG. 2 is a schematic diagram of an exemplary shift register circuit.

FIG. 2 is a schematic diagram of an exemplary shift register circuit. Referring to FIG. 2, a shift register circuit 13 includes a plurality of shift registers. Each shift register includes: a first switch T10, where a control end 101a of the first switch T10 is electrically coupled to a control signal ST, a first end 101b of the first switch T10 is electrically coupled to the control signal ST, and a second end 101c of the first switch T10 is electrically coupled to a first node P1(n); a second switch T20, where a control end 201a of the second switch T20 is electrically coupled to the first node P1(n), a first end 201b of the second switch T20 is electrically coupled to a frequency signal CK, and a second end 201c of the second switch T20 is electrically coupled to an output pulse signal G(n); a third switch T30, where a control end 301a of the third switch T30 is electrically coupled to a second node P2(n), a first end 301b of the third switch T30 is electrically coupled to the output pulse signal G(n), and a second end 301c of the third switch T30 is electrically coupled to a preset low potential Vss; a fourth switch T40, where a control end 401a of the fourth switch T40 is electrically coupled to the second node P2(n), a first end 401b of the fourth switch T40 is electrically coupled to the first node P1(n), and a second end 401c of the fourth switch T40 is electrically coupled to the preset low potential Vss; a pull-down subcircuit 210, electrically coupled to the first node P1(n), the output pulse signal G(n), and the preset low potential Vss of the shift register circuit 13; and a pull-down subcircuit controller 220, electrically coupled to the preset low potential Vss and the pull-down subcircuit 210 of the shift register circuit 13.

Figure 3A:
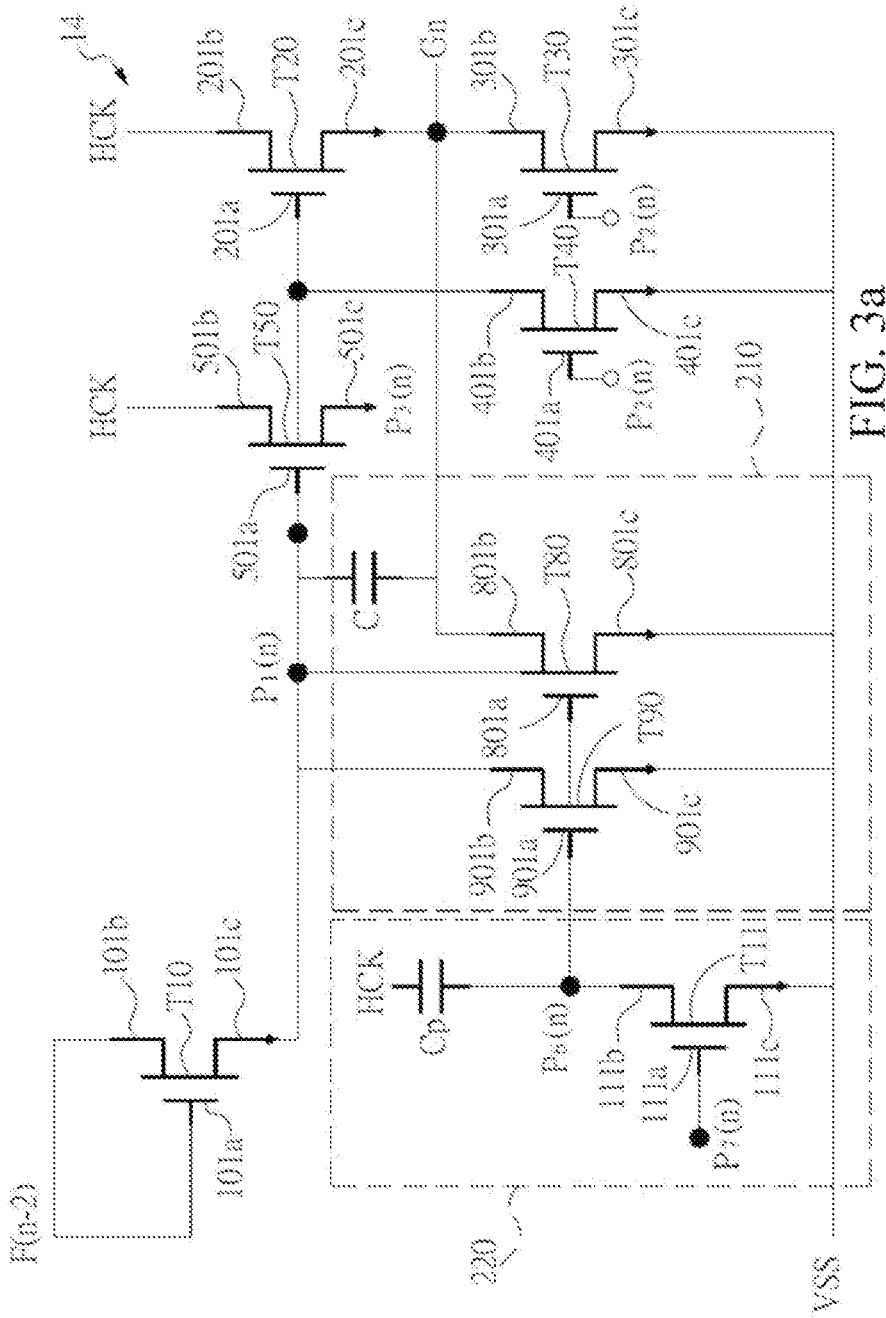
FIG. 3a is a schematic diagram of an exemplary shift register circuit having a high frequency and constant voltage circuit.
Figure 3B:
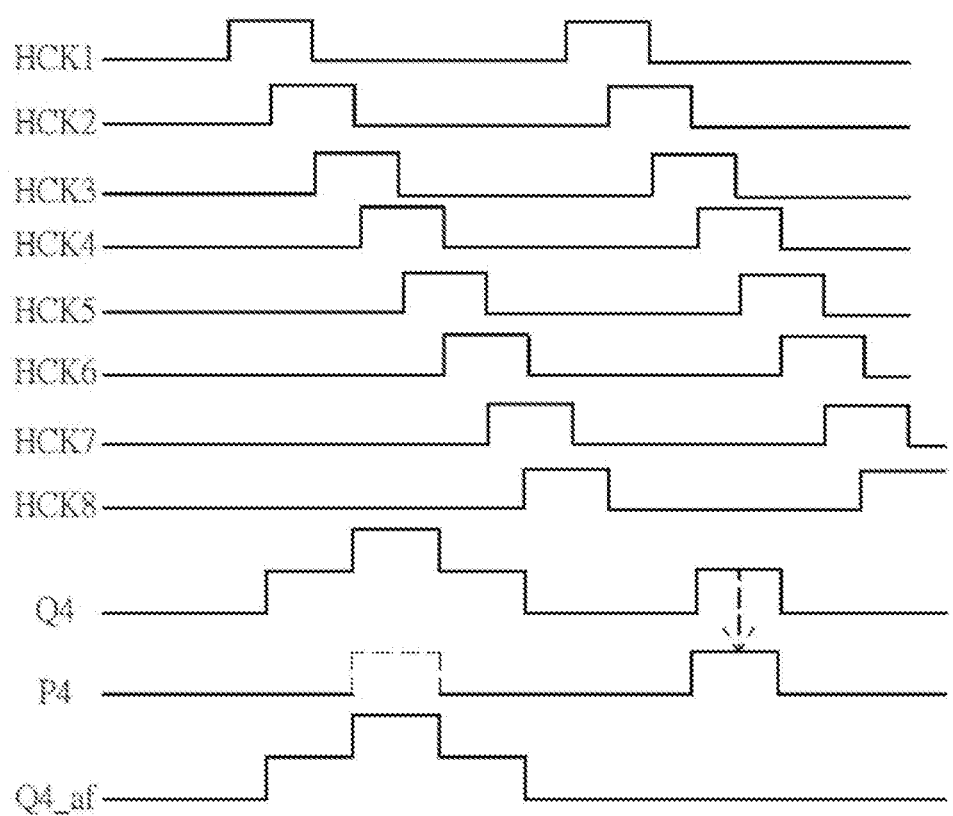
FIG. 3b is a schematic diagram of a waveform of a high frequency and constant voltage circuit.

FIG. 3a is a schematic diagram of an exemplary shift register circuit having a high frequency and constant voltage circuit; and FIG. 3b is a schematic diagram of a waveform of a high frequency and constant voltage circuit. Referring to FIG. 3a and FIG. 3b, a shift register circuit 14 includes a plurality of shift registers. Each shift register includes: a first switch T10, where a control end 101a of the first switch T10 is electrically coupled to a control signal F(n−2), a first end 101b of the first switch T10 is electrically coupled to the control signal F(n−2), and a second end 101c of the first switch T10 is electrically coupled to a first node P1(n); a second switch T20, where a control end 201a of the second switch T20 is electrically coupled to the first node P1(n), a first end 201b of the second switch T20 is electrically coupled to a frequency signal HCK, and a second end 201c of the second switch T20 is electrically coupled to an output pulse signal G(n); a third switch T30, where a control end 301a of the third switch T30 is electrically coupled to a second node P2(n), a first end 301b of the third switch T30 is electrically coupled to the output pulse signal G(n), a second end 301c of the third switch T30 is electrically coupled to a preset low potential Vss; a fourth switch T40, where a control end 401a of the fourth switch T40 is electrically coupled to the second node P2(n), a first end 401b of the fourth switch T40 is electrically coupled to the first node P1(n), and a second end 401c of the fourth switch T40 is electrically coupled to the preset low potential Vss; a fifth switch T50, where a control end 501a of the fifth switch T50 is electrically coupled to the first node P1(n), a first end 501b of the fifth switch T50 is electrically coupled to a frequency signal HCK, and a second end 501c of the fifth switch T50 is electrically coupled to a third node P3(n); an eighth switch T80, where a control end 801a of the eighth switch T80 is electrically coupled to a sixth node P6(n), a first end 801b of the eighth switch T80 is electrically coupled to the output pulse signal G(n), and a second end 801c of the eighth switch T80 is electrically coupled to the preset low potential Vss; a ninth switch T90, where a control end 901a of the ninth switch T90 is electrically coupled to the sixth node P6(n), a first end 901b of the ninth switch T90 is electrically coupled to the first node P1(n), and a second end 901c of the ninth switch T90 is electrically coupled to the preset low potential Vss; and a tenth switch T11, where a control end 111a of the tenth switch T11 is electrically coupled to a seventh node P7(n), a first end 111b of the tenth switch T11 is electrically coupled to the sixth node P6(n), and a second end 111c of the tenth switch T11 is electrically coupled to the preset low potential Vss. The high frequency and constant voltage circuit in a circuit uses a capacitor. Therefore, a low frequency and constant voltage circuit has two more low frequency signals than the high frequency and constant voltage circuit.

Figure 3C:
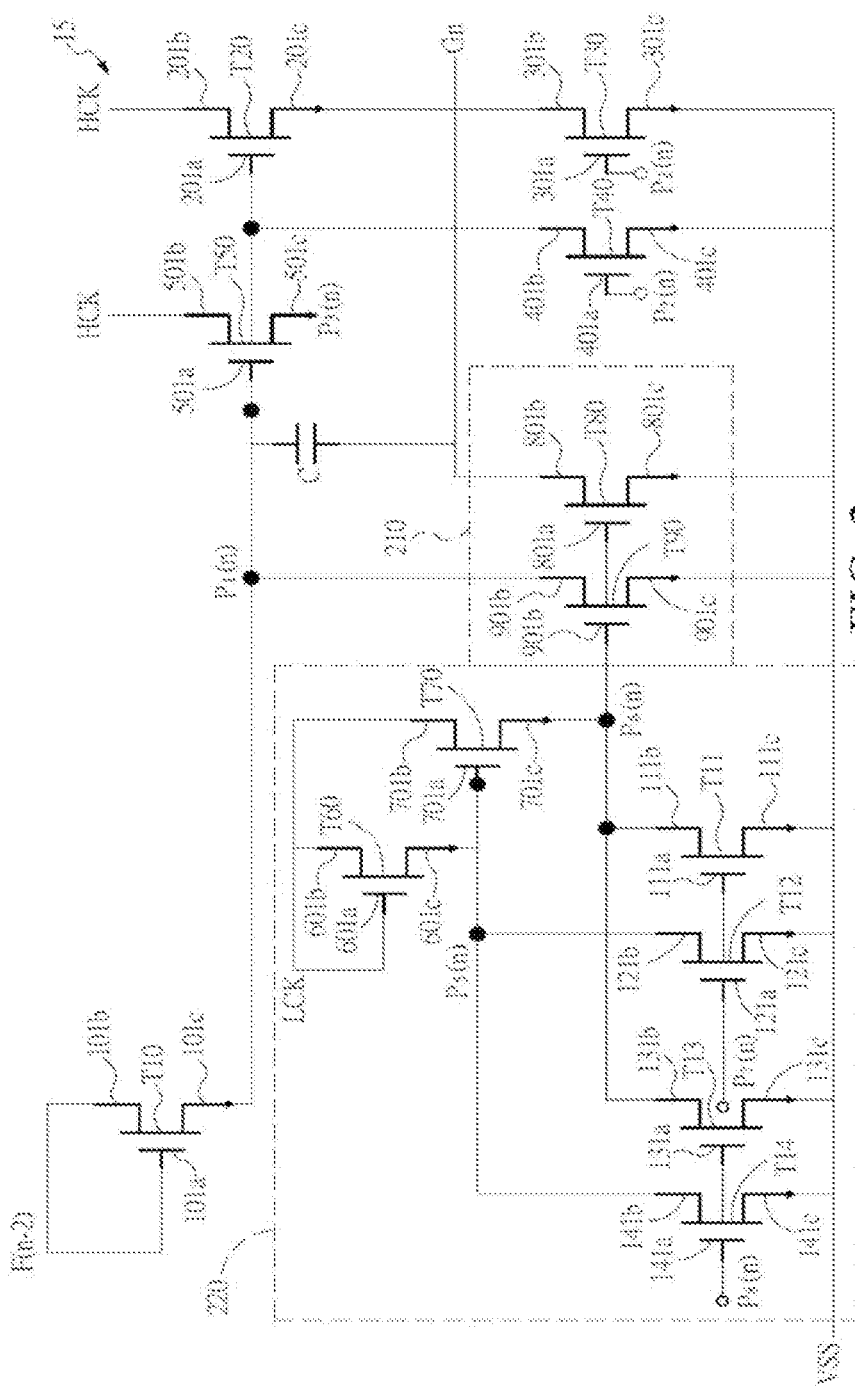
FIG. 3c is a schematic diagram of an exemplary shift register circuit having a low frequency and constant voltage circuit.
Figure 3D:
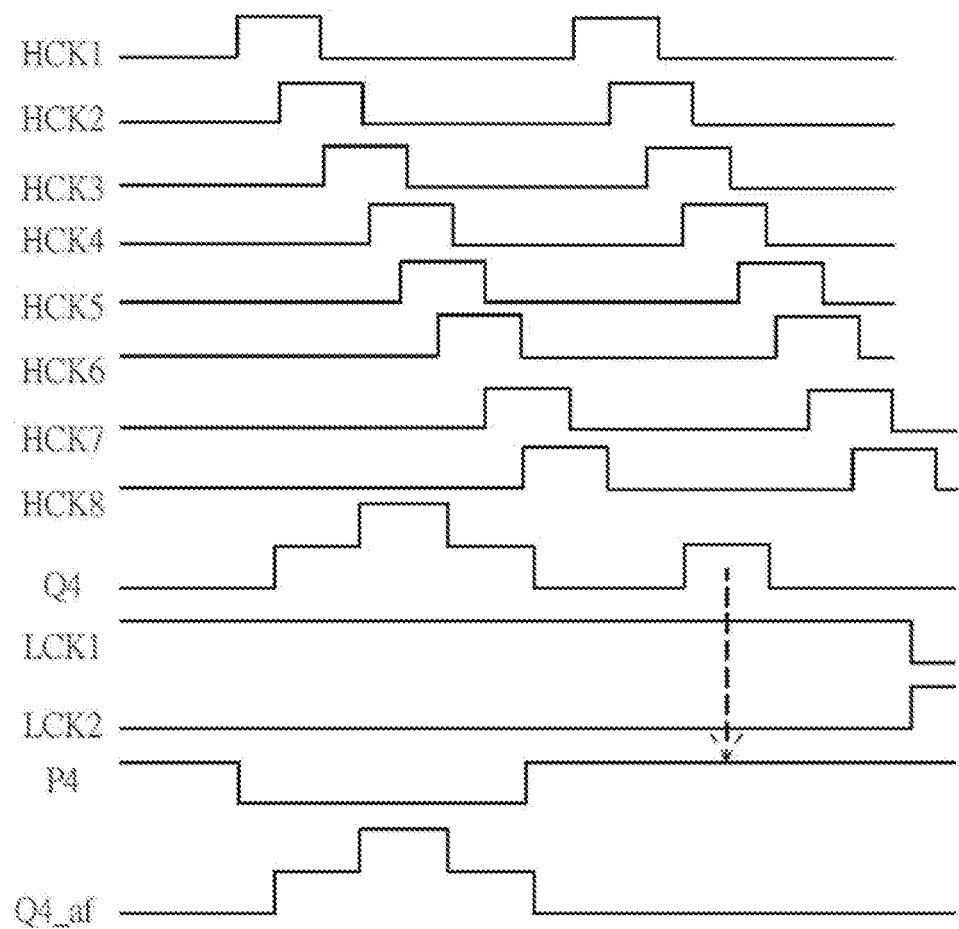
FIG. 3d is a schematic diagram of a waveform of a low frequency and constant voltage circuit.

FIG. 3c is a schematic diagram of an exemplary shift register circuit having a low frequency and constant voltage circuit; and FIG. 3d is a schematic diagram of a waveform of a low frequency and constant voltage circuit. Referring to FIG. 3c and FIG. 3d, a shift register circuit 15 includes a plurality of shift registers. Each shift register includes: a first switch T10, where a control end 101a of the first switch T10 is electrically coupled to a control signal F(n-2), a first end 101b of the first switch T10 is electrically coupled to the control signal F(n-2), and a second end 101c of the first switch T10 is electrically coupled to a first node P1(n); a second switch T20, where a control end 201a of the second switch T20 is electrically coupled to the first node P1(n), a first end 201b of the second switch T20 is electrically coupled to a frequency signal HCK, and a second end 201c of the second switch T20 is electrically coupled to an output pulse signal G(n); a third switch T30, where a control end 301a of the third switch T30 is electrically coupled to a second node P2(n), a first end 301b of the third switch T30 is electrically coupled to the output pulse signal G(n), and a second end 301c of the third switch T30 is electrically coupled to a preset low potential Vss; a fourth switch T40, where a control end 401a of the fourth switch T40 is electrically coupled to the second node P2(n), a first end 401b of the fourth switch T40 is electrically coupled to the first node P1(n), and a second end 401c of the fourth switch T40 is electrically coupled to the preset low potential Vss; a fifth switch T50, where a control end 501a of the fifth switch T50 is electrically coupled to the first node P1(n), a first end 501b of the fifth switch T50 is electrically coupled to a frequency signal HCK, and a second end 501c of the fifth switch T50 is electrically coupled to a third node P3(n); a sixth switch T60, where a control end 601a of the sixth switch T60 is electrically coupled to a low frequency signal LCK, a first end 601b of the sixth switch T60 is electrically coupled to the low frequency signal LCK, and a second end 601c of the sixth switch T60 is electrically coupled to a fifth node P5(n); a seventh switch T70, where a control end 701a of the seventh switch T70 is electrically coupled to the fifth node P5(n), a first end 701b of the seventh switch T70 is electrically coupled to the low frequency signal LCK, and a second end 701c of the seventh switch T70 is electrically coupled to a sixth node P6(n); an eighth switch T80, where a control end 801a of the eighth switch T80 is electrically coupled to the sixth node P6(n), a first end 801b of the eighth switch T80 is electrically coupled to the output pulse signal G(n), and a second end 801c of the eighth switch T80 is electrically coupled to the preset low potential Vss; a ninth switch T90, where a control end 901a of the ninth switch T90 is electrically coupled to the sixth node P6(n), a first end 901b of the ninth switch T90 is electrically coupled to the first node P1(n), a second end 901c of the ninth switch T90 is electrically coupled to the preset low potential Vss; a tenth switch T11, where a control end 111a of the tenth switch T11 is electrically coupled to a seventh node P7(n), a first end 111b of the tenth switch T11 is electrically coupled to the sixth node P6(n), a second end 111c of the tenth switch T11 is electrically coupled to the preset low potential Vss; an eleventh switch T12, where a control end 121a of the eleventh switch T12 is electrically coupled to the seventh node P7(n), a first end 121b of the eleventh switch T12 is electrically coupled to the fifth node P5(n), and a second end 121c of the eleventh switch T12 is electrically coupled to the preset low potential Vss; a twelfth switch T13, where a control end 131a of the twelfth switch T13 is electrically coupled to an eighth node P8(n), a first end 131b of the twelfth switch T13 is electrically coupled to the sixth node P6(n), and a second end 131c of the twelfth switch T13 is electrically coupled to the preset low potential Vss; and a thirteenth switch T14, where a control end 141a of the thirteenth switch T14 is electrically coupled to the eighth node P8(n), a first end 141b of the thirteenth switch T14 is electrically coupled to the fifth node P5(n), and a second end 141c of the thirteenth switch T14 is electrically coupled to the preset low potential Vss. A low frequency and constant voltage circuit has a better effect than a high frequency and constant voltage circuit, but has two more low frequency signals.

Figure 4A:
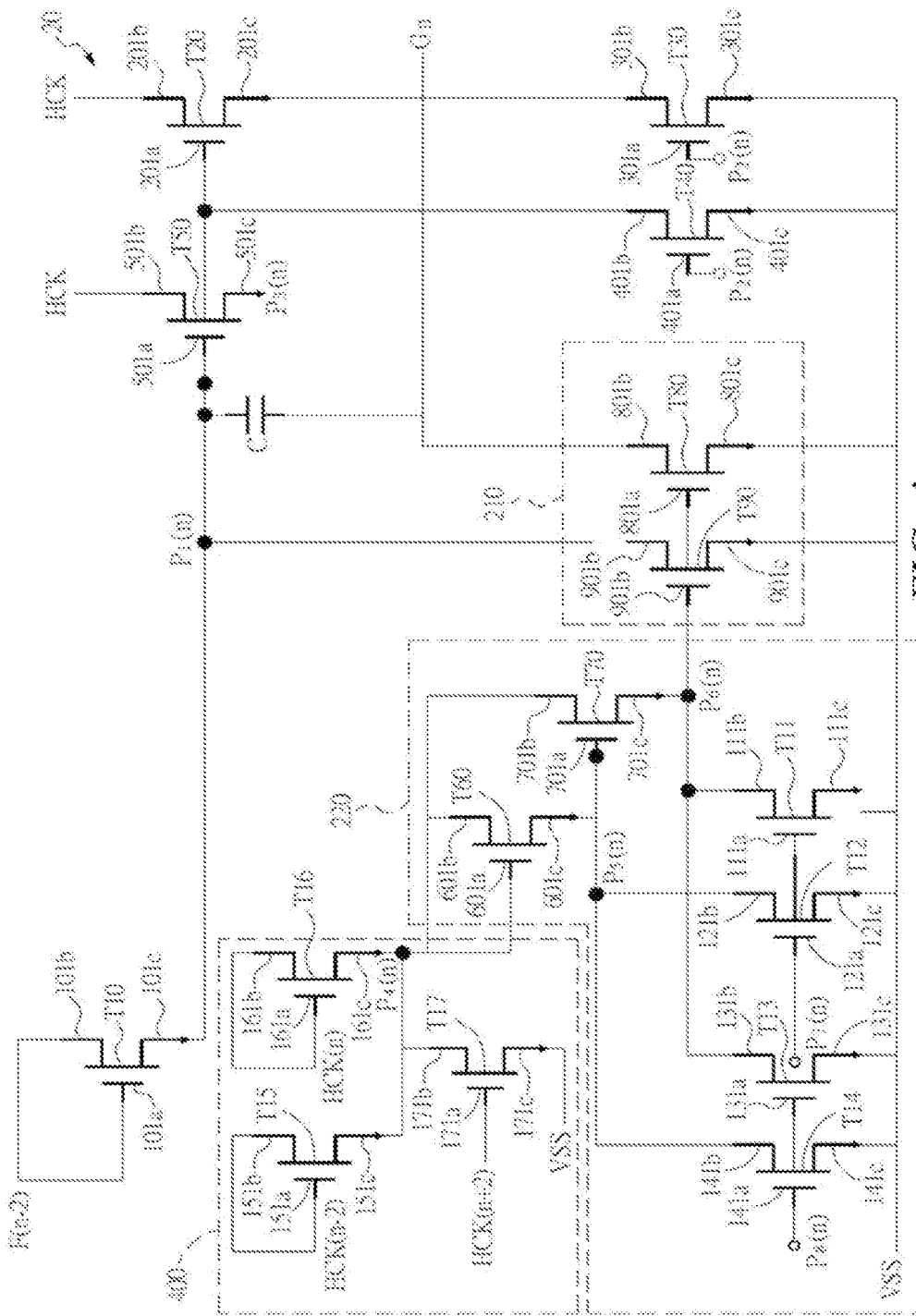
FIG. 4a is a schematic diagram of a shift register circuit having a high frequency signal combinatorial circuit according to an embodiment of this application.
Figure 4B:
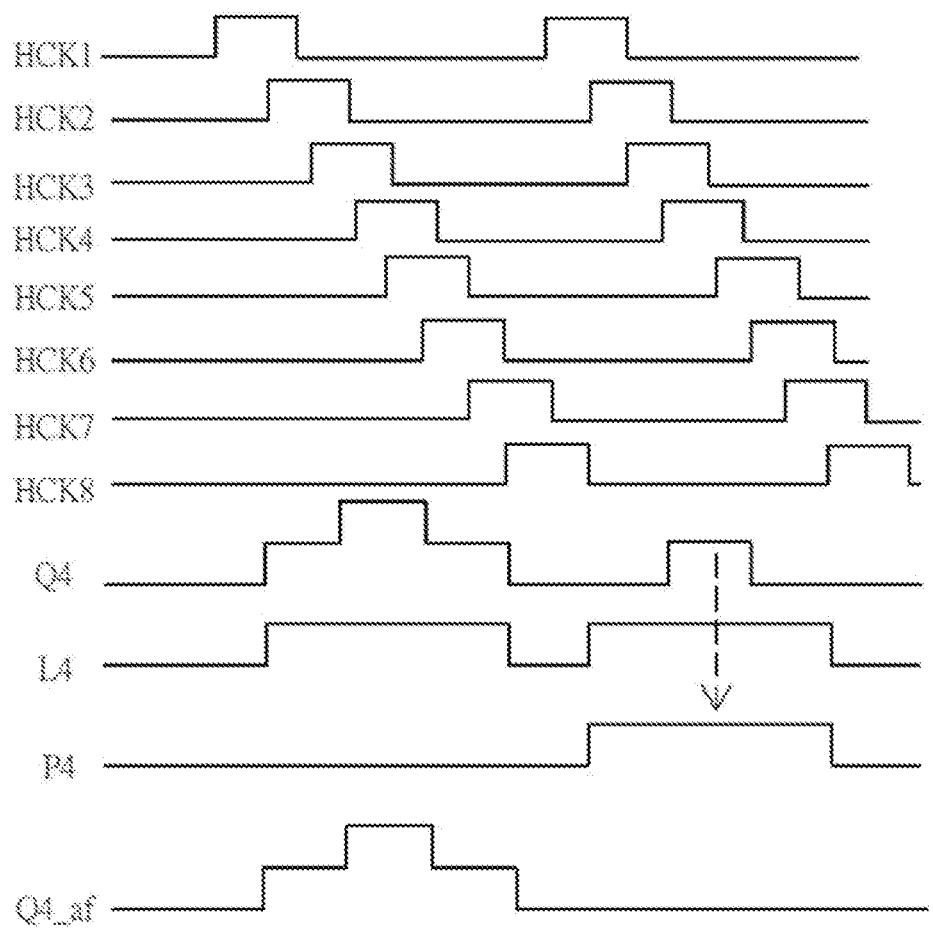
FIG. 4b is a schematic diagram of a waveform of a high frequency signal combinatorial circuit according to an embodiment of this application.

FIG. 4a is a schematic diagram of a shift register circuit having a high frequency signal combinatorial circuit according to an embodiment of this application; and FIG. 4b is a schematic diagram of a waveform of a high frequency signal combinatorial circuit according to an embodiment of this application. Referring to FIG. 4a and FIG. 4b, in an embodiment of this application, a shift register circuit 20 includes a plurality of shift registers. Each shift register includes: a first switch T10, where a control end 101a of the first switch T10 is electrically coupled to a control signal F(n-2), a first end 101b of the first switch T10 is electrically coupled to the control signal F(n-2), and a second end 101c of the first switch T10 is electrically coupled to a first node P1(n); a second switch T20, where a control end 201a of the second switch T20 is electrically coupled to the first node P1(n), a first end 201b of the second switch T20 is electrically coupled to a frequency signal HCK, and a second end 201c of the second switch T20 is electrically coupled to an output pulse signal G(n); a third switch T30, where a control end 301a of the third switch T30 is electrically coupled to a second node P2(n), a first end 301b of the third switch T30 is electrically coupled to the output pulse signal G(n), and a second end 301c of the third switch T30 is electrically coupled to a preset low potential Vss; a fourth switch T40, where a control end 401a of the fourth switch T40 is electrically coupled to the second node P2(n), a first end 401b of the fourth switch T40 is electrically coupled to the first node P1(n), and a second end 401c of the fourth switch T40 is electrically coupled to the preset low potential Vss; a fifth switch T50, where a control end 501a of the fifth switch T50 is electrically coupled to the first node P1(n), a first end 501b of the fifth switch T50 is electrically coupled to a frequency signal HCK, and a second end 501c of the fifth switch T50 is electrically coupled to a third node P3(n); a sixth switch T60, where a control end 601a of the sixth switch T60 is electrically coupled to a fourth node P4(n), a first end 601b of the sixth switch T60 is electrically coupled to the fourth node P4(n), and a second end 601c of the sixth switch T60 is electrically coupled to a fifth node P5(n); a seventh switch T70, where a control end 701a of the seventh switch T70 is electrically coupled to the fifth node P5(n), a first end 701b of the seventh switch T70 is electrically coupled to the fourth node P4(n), and a second end 701c of the seventh switch T70 is electrically coupled to a sixth node P6(n); an eighth switch T80, where a control end 801a of the eighth switch T80 is electrically coupled to the sixth node P6(n), a first end 801b of the eighth switch T80 is electrically coupled to the output pulse signal G(n), and a second end 801c of the eighth switch T80 is electrically coupled to the preset low potential Vss; a ninth switch T90, where a control end 901a of the ninth switch T90 is electrically coupled to the sixth node P6(n), a first end 901b of the ninth switch T90 is electrically coupled to the first node P1(n), and a second end 901c of the ninth switch T90 is electrically coupled to the preset low potential Vss; a tenth switch T11, where a control end 111a of the tenth switch T11 is electrically coupled to a seventh node P7(n), a first end 111b of the tenth switch T11 is electrically coupled to the sixth node P6(n), and a second end 111c of the tenth switch T11 is electrically coupled to the preset low potential Vss; an eleventh switch T12, where a control end 121a of the eleventh switch T12 is electrically coupled to the seventh node P7(n), a first end 121b of the eleventh switch T12 is electrically coupled to the fifth node P5(n), and a second end 121c of the eleventh switch T12 is electrically coupled to the preset low potential Vss; a twelfth switch T13, where a control end 131a of the twelfth switch T13 is electrically coupled to an eighth node P8(n), a first end 131b of the twelfth switch T13 is electrically coupled to the sixth node P6(n), and a second end 131c of the twelfth switch T13 is electrically coupled to the preset low potential Vss; a thirteenth switch T14, where a control end 141a of the thirteenth switch T14 is electrically coupled to the eighth node P8(n), a first end 141b of the thirteenth switch T14 is electrically coupled to the fifth node P5(n), and a second end 141c of the thirteenth switch T14 is electrically coupled to the preset low potential Vss; and a high frequency signal circuit 400, electrically coupled to the preset low potential Vss, the sixth switch T60, and the seventh switch T70 of the shift register circuit 20.

Referring to FIG. 4a and FIG. 4b, in an embodiment of this application, a shift register circuit 20 includes a plurality of shift registers. Each shift register includes: a first switch T10, where a control end 101a of the first switch T10 is electrically coupled to a control signal F(n−2), a first end 101b of the first switch T10 is electrically coupled to the control signal F(n−2), and a second end 101c of the first switch T10 is electrically coupled to a first node P1(n); a second switch T20, where a control end 201a of the second switch T20 is electrically coupled to the first node P1(n), a first end 201b of the second switch T20 is electrically coupled to a frequency signal HCK, and a second end 201c of the second switch T20 is electrically coupled to an output pulse signal G(n); a third switch T30, where a control end 301a of the third switch T30 is electrically coupled to a second node P2(n), a first end 301b of the third switch T30 is electrically coupled to the output pulse signal G(n), and a second end 301c of the third switch T30 is electrically coupled to a preset low potential Vss; a fourth switch T40, where a control end 401a of the fourth switch T40 is electrically coupled to the second node P2(n), a first end 401b of the fourth switch T40 is electrically coupled to the first node P1(n), and a second end 401c of the fourth switch T40 is electrically coupled to the preset low potential Vss; a fifth switch T50, where a control end 501a of the fifth switch T50 is electrically coupled to the first node P1(n), a first end 501b of the fifth switch T50 is electrically coupled to a frequency signal HCK, and a second end 501c of the fifth switch T50 is electrically coupled to a third node P3(n); a sixth switch T60, where a control end 601a of the sixth switch T60 is electrically coupled to a fourth node P4(n), a first end 601b of the sixth switch T60 is electrically coupled to the fourth node P4(n), and a second end 601c of the sixth switch T60 is electrically coupled to a fifth node P5(n); a seventh switch T70, where a control end 701a of the seventh switch T70 is electrically coupled to the fifth node P5(n), a first end 701b of the seventh switch T70 is electrically coupled to the fourth node P4(n), and a second end 701c of the seventh switch T70 is electrically coupled to a sixth node P6(n); an eighth switch T80, where a control end 801a of the eighth switch T80 is electrically coupled to the sixth node P6(n), a first end 801b of the eighth switch T80 is electrically coupled to the output pulse signal G(n), and a second end 801c of the eighth switch T80 is electrically coupled to the preset low potential Vss; a ninth switch T90, where a control end 901a of the ninth switch T90 is electrically coupled to the sixth node P6(n), a first end 901b of the ninth switch T90 is electrically coupled to the first node P1(n), and a second end 901c of the ninth switch T90 is electrically coupled to the preset low potential Vss; a tenth switch T11, where a control end 111a of the tenth switch T11 is electrically coupled to a seventh node P7(n), a first end 111b of the tenth switch T11 is electrically coupled to the sixth node P6(n), and a second end 111c of the tenth switch T11 is electrically coupled to the preset low potential Vss; an eleventh switch T12, where a control end 121a of the eleventh switch T12 is electrically coupled to the seventh node P7(n), a first end 121b of the eleventh switch T12 is electrically coupled to the fifth node P5(n), and a second end 121c of the eleventh switch T12 is electrically coupled to the preset low potential Vss; a twelfth switch T13, where a control end 131a of the twelfth switch T13 is electrically coupled to an eighth node P8(n), a first end 131b of the twelfth switch T13 is electrically coupled to the sixth node P6(n), and a second end 131c of the twelfth switch T13 is electrically coupled to the preset low potential Vss; a thirteenth switch T14, where a control end 141a of the thirteenth switch T14 is electrically coupled to the eighth node P8(n), a first end 141b of the thirteenth switch T14 is electrically coupled to the fifth node P5(n), and a second end 141c of the thirteenth switch T14 is electrically coupled to the preset low potential Vss; and a high frequency signal circuit 400, electrically coupled to the preset low potential Vss, the sixth switch T60, and the seventh switch T70 of the shift register circuit 20. The high frequency signal circuit 400 further includes a fourteenth switch T15, where a control end 151a of the fourteenth switch T15 is electrically coupled to a frequency signal HCK(n−2), a first end 151b of the fourteenth switch T15 is electrically coupled to the frequency signal HCK(n−2), and a second end 151c of the fourteenth switch T15 is electrically coupled to the fourth node P4(n); a fifteenth switch T16, where a control end 161a of the fifteenth switch T16 is electrically coupled to a frequency signal HCK(n), a first end 161b of the fifteenth switch T16 is electrically coupled to the frequency signal HCK(n), and a second end 161c of the fifteenth switch T16 is electrically coupled to the fourth node P4(n); and a sixteenth switch T17, where a control end 171a of the sixteenth switch T17 is electrically coupled to a frequency signal HCK (n+2), a first end 171b of the sixteenth switch T17 is electrically coupled to the fourth node P4(n), and a second end 171c of the sixteenth switch T17 is electrically coupled to the preset low potential Vss.

Referring to FIG. 4a, in an embodiment of this application, the shift register circuit 20 further includes a pull-down subcircuit 210, including: an eighth switch T80, where a control end 801a of the eighth switch T80 is electrically coupled to the sixth node P6(n), a first end 801b of the eighth switch T80 is electrically coupled to the output pulse signal G(n), and a second end 801c of the eighth switch T80 is electrically coupled to the preset low potential Vss; and a ninth switch T90, where a control end 901a of the ninth switch T90 is electrically coupled to the sixth node P6(n), a first end 901b of the ninth switch T90 is electrically coupled to the first node P1(n), and a second end 901c of the ninth switch T90 is electrically coupled to the preset low potential Vss.

Referring to FIG. 4a, in an embodiment of this application, the shift register circuit 20 further includes a pull-down subcircuit controller 220, including: the sixth switch T60, where the control end 601a of the sixth switch T60 is electrically coupled to the fourth node P4(n), the first end 601b of the sixth switch T60 is electrically coupled to the fourth node P4(n), and the second end 601c of the sixth switch T60 is electrically coupled to the fifth node P5(n); and the seventh switch T70, where the control end 701a of the seventh switch T70 is electrically coupled to the fifth node P5(n), the first end 701b of the seventh switch T70 is electrically coupled to the fourth node P4(n), and the second end 701c of the seventh switch T70 is electrically coupled to the sixth node P6(n). The shift register circuit 20 further includes: a tenth switch T11, where a control end 111a of the tenth switch T11 is electrically coupled to a seventh node P7(n), a first end 111b of the tenth switch T11 is electrically coupled to the sixth node P6(n), and a second end 111c of the tenth switch T11 is electrically coupled to the preset low potential Vss; an eleventh switch T12, where a control end 121a of the eleventh switch T12 is electrically coupled to the seventh node P7(n), a first end 121b of the eleventh switch T12 is electrically coupled to the fifth node P5(n), and a second end 121c of the eleventh switch T12 is electrically coupled to the preset low potential Vss; a twelfth switch T13, where a control end 131a of the twelfth switch T13 is electrically coupled to an eighth node P8(n), a first end 131b of the twelfth switch T13 is electrically coupled to the sixth node P6(n), and a second end 131c of the twelfth switch T13 is electrically coupled to the preset low potential Vss; and a thirteenth switch T14, where a control end 141a of the thirteenth switch T14 is electrically coupled to the eighth node P8(n), a first end 141b of the thirteenth switch T14 is electrically coupled to the fifth node P5(n), and a second end 141c of the thirteenth switch T14 is electrically coupled to the preset low potential Vss.

Referring to FIG. 4a, in an embodiment of this application, a display panel includes: a first substrate (not shown in the figure); a second substrate (not shown in the figure), disposed opposite to the first substrate; and the shift register circuit 20, where the shift register circuit 20 is disposed on the first substrate or the second substrate.

This application can also achieve a low frequency and constant voltage effect by using a high frequency signal combination.

Phrases such as "in some embodiments" and "in various embodiments" are used repeatedly. They usually do not refer to a same embodiment; but they may refer to a same embodiment. Terms such as "contain", "have", and "include" are synonymous unless otherwise described in context.

Descriptions above are merely embodiments of this application, and are not intended to limit this application in any form. Although this application has been disclosed above in forms of specific embodiments, the embodiments are not intended to limit this application. A person skilled in the art can make some equivalent variations, alterations or modifications to the above disclosed technical content without departing from the scope of the technical solutions of the above disclosed technical content to obtain equivalent embodiments. Any simple alteration, equivalent change or modification made to the foregoing embodiments according to the technical essence of this application without departing from the content of the technical solutions of this application shall fall within the scope of the technical solutions of this application.

What is claimed is:

1. A shift register circuit, comprising a plurality of shift registers, wherein each shift register comprises:
 a first switch, wherein a control end of the first switch is electrically coupled to a control signal, a first end of the first switch is electrically coupled to the control signal, and a second end of the first switch is electrically coupled to a first node;
 a second switch, wherein a control end of the second switch is electrically coupled to the first node, a first end of the second switch is electrically coupled to a frequency signal, and a second end of the second switch is electrically coupled to an output pulse signal;
 a third switch, wherein a control end of the third switch is electrically coupled to a second node, a first end of the third switch is electrically coupled to the output pulse signal, and a second end of the third switch is electrically coupled to a preset low potential;
 a fourth switch, wherein a control end of the fourth switch is electrically coupled to the second node, a first end of the fourth switch is electrically coupled to the first node, and a second end of the fourth switch is electrically coupled to the preset low potential;
 a fifth switch, wherein a control end of the fifth switch is electrically coupled to the first node, a first end of the fifth switch is electrically coupled to a frequency signal, and a second end of the fifth switch is electrically coupled to a third node;
 a sixth switch, wherein a control end of the sixth switch is electrically coupled to a fourth node, a first end of the sixth switch is electrically coupled to the fourth node, and a second end of the sixth switch is electrically coupled to a fifth node;

a seventh switch, wherein a control end of the seventh switch is electrically coupled to the fifth node, a first end of the seventh switch is electrically coupled to the fourth node, and a second end of the seventh switch is electrically coupled to a sixth node; and a high frequency signal circuit, electrically coupled to the preset low potential, the sixth switch, and the seventh switch of the shift register circuit.

2. The shift register circuit according to claim 1, further comprising a pull-down subcircuit, comprising: an eighth switch, wherein a control end of the eighth switch is electrically coupled to the sixth node, a first end of the eighth switch is electrically coupled to the output pulse signal, and a second end of the eighth switch is electrically coupled to the preset low potential.

3. The shift register circuit according to claim 2, further comprising a ninth switch, wherein a control end of the ninth switch is electrically coupled to the sixth node, a first end of the ninth switch is electrically coupled to the first node, and a second end of the ninth switch is electrically coupled to the preset low potential.

4. The shift register circuit according to claim 1, further comprising a pull-down subcircuit controller, comprising: the sixth switch, wherein the control end of the sixth switch is electrically coupled to the fourth node, the first end of the sixth switch is electrically coupled to the fourth node, and the second end of the sixth switch is electrically coupled to the fifth node; and the seventh switch, wherein the control end of the seventh switch is electrically coupled to the fifth node, the first end of the seventh switch is electrically coupled to the fourth node, and the second end of the seventh switch is electrically coupled to the sixth node.

5. The shift register circuit according to claim 4, further comprising a tenth switch, wherein a control end of the tenth switch is electrically coupled to a seventh node, a first end of the tenth switch is electrically coupled to the sixth node, and a second end of the tenth switch is electrically coupled to the preset low potential.

6. The shift register circuit according to claim 4, further comprising an eleventh switch, wherein a control end of the eleventh switch is electrically coupled to a seventh node, a first end of the eleventh switch is electrically coupled to the fifth node, and a second end of the eleventh switch is electrically coupled to the preset low potential.

7. The shift register circuit according to claim 4, further comprising a twelfth switch, wherein a control end of the twelfth switch is electrically coupled to an eighth node, a first end of the twelfth switch is electrically coupled to the sixth node, a second end of the twelfth switch is electrically coupled to the preset low potential and a thirteenth switch, a control end of the thirteenth switch is electrically coupled to the eighth node, a first end of the thirteenth switch is electrically coupled to the fifth node, and a second end of the thirteenth switch is electrically coupled to the preset low potential.

8. The shift register circuit according to claim 1, wherein the high frequency signal circuit further comprises a fourteenth switch, a control end of the fourteenth switch is electrically coupled to a frequency signal, a first end of the fourteenth switch is electrically coupled to the frequency signal, and a second end of the fourteenth switch is electrically coupled to the fourth node.

9. The shift register circuit according to claim 1, wherein the high frequency signal circuit further comprises a fifteenth switch, a control end of the fifteenth switch is electrically coupled to a frequency signal, a first end of the fifteenth switch is electrically coupled to the frequency signal, and a second end of the fifteenth switch is electrically coupled to the fourth node.

10. The shift register circuit according to claim 1, wherein the high frequency signal circuit further comprises a sixteenth switch, a control end of the sixteenth switch is electrically coupled to a frequency signal, a first end of the sixteenth switch is electrically coupled to the fourth node, and a second end of the sixteenth switch is electrically coupled to the preset low potential.

11. A shift register circuit, comprising a plurality of shift registers, wherein each shift register comprises:

a first switch, wherein a control end of the first switch is electrically coupled to a control signal, a first end of the first switch is electrically coupled to the control signal, and a second end of the first switch is electrically coupled to a first node;

a second switch, wherein a control end of the second switch is electrically coupled to the first node, a first end of the second switch is electrically coupled to a frequency signal, and a second end of the second switch is electrically coupled to an output pulse signal;

a third switch, wherein a control end of the third switch is electrically coupled to a second node, a first end of the third switch is electrically coupled to the output pulse signal, and a second end of the third switch is electrically coupled to a preset low potential;

a fourth switch, wherein a control end of the fourth switch is electrically coupled to the second node, a first end of the fourth switch is electrically coupled to the first node, and a second end of the fourth switch is electrically coupled to the preset low potential;

a fifth switch, wherein a control end of the fifth switch is electrically coupled to the first node, a first end of the fifth switch is electrically coupled to a frequency signal, and a second end of the fifth switch is electrically coupled to a third node;

a sixth switch, wherein a control end of the sixth switch is electrically coupled to a fourth node, a first end of the sixth switch is electrically coupled to the fourth node, and a second end of the sixth switch is electrically coupled to a fifth node;

a seventh switch, wherein a control end of the seventh switch is electrically coupled to the fifth node, a first end of the seventh switch is electrically coupled to the fourth node, and a second end of the seventh switch is electrically coupled to a sixth node; and a high frequency signal circuit, electrically coupled to the preset low potential, the sixth switch, and the seventh switch of the shift register circuit, wherein the high frequency signal circuit further comprises: a fourteenth switch, wherein a control end of the fourteenth switch is electrically coupled to a frequency signal, a first end of the fourteenth switch is electrically coupled to the frequency signal, and a second end of the fourteenth switch is electrically coupled to the fourth node; a fifteenth switch, wherein a control end of the fifteenth switch is electrically coupled to a frequency signal, a first end of the fifteenth switch is electrically coupled to the frequency signal, and a second end of the fifteenth switch is electrically coupled to the fourth node; and a sixteenth switch, wherein a control end of the sixteenth switch is electrically coupled to a frequency signal, a first end of the sixteenth switch is electrically coupled to the fourth node, and a second end of the sixteenth switch is electrically coupled to the preset low potential.

12. A display panel, comprising:
a first substrate;
a second substrate, disposed opposite to the first substrate; and
a shift register circuit, comprising a plurality of shift registers, wherein each shift register comprises:
a first switch, wherein a control end of the first switch is electrically coupled to a control signal, a first end of the first switch is electrically coupled to the control signal, and a second end of the first switch is electrically coupled to a first node;
a second switch, wherein a control end of the second switch is electrically coupled to the first node, a first end of the second switch is electrically coupled to a frequency signal, and a second end of the second switch is electrically coupled to an output pulse signal;
a third switch, wherein a control end of the third switch is electrically coupled to a second node, a first end of the third switch is electrically coupled to the output pulse signal, and a second end of the third switch is electrically coupled to a preset low potential;
a fourth switch, wherein a control end of the fourth switch is electrically coupled to the second node, a first end of the fourth switch is electrically coupled to the first node, and a second end of the fourth switch is electrically coupled to the preset low potential;
a fifth switch, wherein a control end of the fifth switch is electrically coupled to the first node, a first end of the fifth switch is electrically coupled to a frequency signal, and a second end of the fifth switch is electrically coupled to a third node;
a sixth switch, wherein a control end of the sixth switch is electrically coupled to a fourth node, a first end of the sixth switch is electrically coupled to the fourth node, and a second end of the sixth switch is electrically coupled to a fifth node;
a seventh switch, wherein a control end of the seventh switch is electrically coupled to the fifth node, a first end of the seventh switch is electrically coupled to the fourth node, and a second end of the seventh switch is electrically coupled to a sixth node; and
a high frequency signal circuit, electrically coupled to the preset low potential, the sixth switch, and the seventh switch of the shift register circuit, wherein the shift register circuit is disposed on the first substrate or the second substrate.

13. The display panel according to claim 12, further comprising a pull-down subcircuit, comprising: an eighth switch, wherein a control end of the eighth switch is electrically coupled to the sixth node, a first end of the eighth switch is electrically coupled to the output pulse signal, and a second end of the eighth switch is electrically coupled to the preset low potential.

14. The display panel according to claim 13, further comprising a ninth switch, wherein a control end of the ninth switch is electrically coupled to the sixth node, a first end of the ninth switch is electrically coupled to the first node, and a second end of the ninth switch is electrically coupled to the preset low potential.

15. The display panel according to claim 12, further comprising a pull-down subcircuit controller, comprising: the sixth switch, wherein the control end of the sixth switch is electrically coupled to the fourth node, the first end of the sixth switch is electrically coupled to the fourth node, and the second end of the sixth switch is electrically coupled to the fifth node; and the seventh switch, wherein the control end of the seventh switch is electrically coupled to the fifth node, the first end of the seventh switch is electrically coupled to the fourth node, and the second end of the seventh switch is electrically coupled to the sixth node.

16. The display panel according to claim 15, further comprising a tenth switch, wherein a control end of the tenth switch is electrically coupled to a seventh node, a first end of the tenth switch is electrically coupled to the sixth node, and a second end of the tenth switch is electrically coupled to the preset low potential.

17. The display panel according to claim 15, further comprising an eleventh switch, wherein a control end of the eleventh switch is electrically coupled to a seventh node, a first end of the eleventh switch is electrically coupled to the fifth node, and a second end of the eleventh switch is electrically coupled to the preset low potential.

18. The display panel according to claim 15, further comprising a twelfth switch, wherein a control end of the twelfth switch is electrically coupled to an eighth node, a first end of the twelfth switch is electrically coupled to the sixth node, a second end of the twelfth switch is electrically coupled to the preset low potential and a thirteenth switch, a control end of the thirteenth switch is electrically coupled to the eighth node, a first end of the thirteenth switch is electrically coupled to the fifth node, and a second end of the thirteenth switch is electrically coupled to the preset low potential.

19. The display panel according to claim 12, wherein the high frequency signal circuit further comprises a fourteenth switch, a control end of the fourteenth switch is electrically coupled to a frequency signal, a first end of the fourteenth switch is electrically coupled to the frequency signal, and a second end of the fourteenth switch is electrically coupled to the fourth node.

20. The display panel according to claim 12, wherein the high frequency signal circuit further comprises a fifteenth switch, a control end of the fifteenth switch is electrically coupled to a frequency signal, a first end of the fifteenth switch is electrically coupled to the frequency signal, and a second end of the fifteenth switch is electrically coupled to the fourth node.

* * * * *